United States Patent
Hsieh et al.

(10) Patent No.: US 6,174,772 B1
(45) Date of Patent: Jan. 16, 2001

(54) OPTIMAL PROCESS FLOW OF FABRICATING NITRIDE SPACER WITHOUT INTER-POLY OXIDE DAMAGE IN SPLIT GATE FLASH

(75) Inventors: Chia-Ta Hsieh, Tainan; Yai-Fen Lin, Non-Tour; Hung-Cheng Sung; Jack Yeh, both of Hsin-Chu; Di-Son Kuo, Hsinchu, all of (TW)

(73) Assignee: Taiwan Semiconductor Manufacturing Company, Hsin-Chu (TW)

(*) Notice: Under 35 U.S.C. 154(b), the term of this patent shall be extended for 0 days.

(21) Appl. No.: 09/347,548

(22) Filed: Jul. 6, 1999

(51) Int. Cl.$^7$ .................... H01L 21/336; H01L 29/788
(52) U.S. Cl. .................... 438/264; 438/265; 438/257; 257/321
(58) Field of Search .................... 438/257, 264, 438/265, 266, 286, 303; 257/321

(56) References Cited

U.S. PATENT DOCUMENTS

| | | | |
|---|---|---|---|
| 5,063,172 | 11/1991 | Manley | 437/43 |
| 5,702,965 | 12/1997 | Kim | 47/43 |
| 5,811,853 | 9/1998 | Wang | 257/316 |
| 5,879,992 | * 3/1999 | Hsieh et al. | 438/264 |
| 5,915,178 | * 6/1999 | Chiang et al. | 438/266 |
| 5,998,290 | * 12/1999 | Wu et al. | 438/595 |
| 6,001,690 | * 12/1999 | Chien et al. | 438/266 |

* cited by examiner

Primary Examiner—Matthew Smith
Assistant Examiner—Lex H. Malsawma
(74) Attorney, Agent, or Firm—George O. Saile; Stephen B. Ackerman

(57) ABSTRACT

A method is disclosed to form a split-gate flash memory cell having nitride spacers formed on a pad oxide and prior the forming of an inter-poly oxide layer thereover. In this manner, any damage that would normally occur to the inter-poly oxide during the etching of the nitride spacers subsequent to the forming of the inter-poly oxide is avoided. Consequently, the variation in the thickness of the inter-poly oxide due to the unpredictable damage to the underlying spacers is also avoided by reversing the order in which the spacers and the inter-poly oxide are formed, including the forming of the pad oxide first. As a result, variation in the erase speed of the inter-gate flash memory cell is prevented, both for cells fabricated on the same wafer as well as on different wafers on same or different production lines.

21 Claims, 3 Drawing Sheets

FIG. 1 - Prior Art

OPTIMAL PROCESS FLOW OF FABRICATING NITRIDE SPACER WITHOUT INTER-POLY OXIDE DAMAGE IN SPLIT GATE FLASH

BACKGROUND OF THE INVENTION (1) Field of the Invention

The present invention relates to split-gate memory cells used in flash EEPROMs (Electrically Erasable Programmable Read Only Memories), and in particular, to a method of forming a nitride spacer without inter-poly oxide damage in the cell.

(2) Description of the Related Art

A spacer between the floating gate and the word line (connected to the control gate) of a split gate flash memory cell is needed in order to avoid reverse tunneling, or, "write disturb" as is known in the art. However, the process of forming spacers after the forming of inter-poly oxide as currently practiced in the manufacturing line causes damage to the spacers. The amount and nature of damage varies from one cell to another on a given wafer, thus causing undesirable variations in the erasing speed of the manufactured memory devices. It is disclosed later in the embodiments of the present invention a method of forming a spacer and an additional inter-poly oxide which, together, substantially reduce such variations within a wafer as well as from wafer to wafer in the production line.

Most conventional flash-EEPROM cells use a double-polysilicon (poly) structure of which the well known split-gate cell is shown in FIG. 1. There, a MOS transistor is formed on a semiconductor substrate (10) having a first doped region (11), a second doped region (13), a channel region (15), a gate oxide (30), a floating gate (40), intergate dielectric layer (50) and control gate (60). Substrate (10) and channel region (15) have a first conductivity type, and the first (11) and second (13) doped regions have a second conductivity type that is opposite the first conductivity type.

As seen in FIG. 1, the first doped region, (11), lies within the substrate. The second doped region, (13), lies within substrate (10) and is spaced apart form the first doped region (11). Channel region (15) lies within substrate (10) and between first (11) and second (13) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In the structure shown in FIG. 1, control gate (60) overlaps the channel region, (17), adjacent to channel (15) under the floating gate, (40). It will be known to those skilled in the art that this structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (17) determines the cell performance.

To program the transistor shown in FIG. 1 which shows the placement of gate, source and drain voltages or $V_g$, $V_s$ and $V_d$, respectively, charge is transferred from substrate (10) through gate oxide (30) and is stored on floating gate (40) of the transistor. The amount of charge is set to one of two levels to indicate whether the cell has been programmed "on" or "off." "Reading" of the cell's state is accomplished by applying appropriate voltages to the cell source (11) and drain (13), and to control gate (60), and then sensing the amount of charge on floating gate (40). To erase the contents of the cell, the programming process is reversed, namely, charges are removed from the floating gate by transferring them back to the substrate through the gate oxide. Electron tunneling occurs through oxide regions (33) and (53) shown in FIG. 1.

This programming and erasing of an EEPROM is accomplished electrically and in-circuit by using Fowler-Nordheim (F-N) tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of importance in the tunneling region is the quality and the thinness of the tunneling oxide separating the floating gate from the substrate. Inadvertent reverse tunneling, or erasure, for example, may occur if the tunnel oxide is degraded, or the spacer formed between the floating gate and the control gate is poorly shaped.

In prior art, spacers are employed for various purposes. Wang in U.S. Pat. No. 5,811,853 forms a thick spacer oxide layer on top of a floating gate and the source/drain region of a substrate to prevent shorting thereinbetween in a memory cell. In U.S. Pat. No. 5,063,172, Manley teaches a circuit fabrication method that utilizes a conductive spacer to define the gate length of a series select transistor in a split-gate memory cell. Kim of U.S. Pat. No. 5,702,965, on the other hand, discloses a flash memory cell with an insulation spacer of an oxide-nitride-oxide (ONO) or ON structure formed at the sidewalls of the floating gate. Present invention discloses a different method of forming a split-gate flash memory cell where nitride spacers are formed first on a pad oxide formed on the sidewalls of a floating gate, and then the inter-poly oxide is formed thereon. In this manner, the damage to the inter-poly oxide is avoided and the variation in the thickness of the inter-poly oxide is also substantially reduced in order to prevent the variation of the erase speed of the memory cells fabricated on the same or different wafers.

SUMMARY OF THE INVENTION

It is therefore an object of this invention to provide a method of forming a nitride spacer through a reversal of conventional process steps in order to avoid reverse tunneling disturb in a split-gate flash memory cell.

It is another object of this invention to provide method of forming a nitride spacer without inter-poly oxide damage in a split-gate flash memory cell.

It is still another object of this invention to provide a method of preventing variations in the thickness of inter-poly oxide in order to prevent variations in the erase speed of a split-gate flash memory cell.

It is yet another object of the present invention to provide split-gate flash memory cell having a nitride spacer underlying inter-poly oxide layer in order to suppress the variations in the thickness of the inter-poly oxide.

These objects are accomplished by providing a substrate having a plurality of active and field regions defined; forming a gate oxide layer over said substrate; forming a first polysilicon layer over said gate oxide layer; forming a first nitride layer over said first polysilicon layer; patterning said first nitride layer to define a floating gate region over said first polysilicon layer; forming a poly-oxide layer over said first polysilicon layer; etching said first polysilicon layer to form a floating gate structure; forming a pad oxide layer over said substrate; forming a second nitride layer over said pad oxide layer; etching said second nitride layer to form nitride spacers; removing said pad oxide layer; forming an inter-poly oxide layer over said substrate; forming a second polysilicon layer over said inter-poly oxide layer; and patterning said second polysilicon layer to form a control gate structure of said split-gate flash memory cells.

BRIEF DESCRIPTION OF THE DRAWINGS

FIG. 1 is a ross-sectional view of a portion of a semiconductor substrate showing a split-gate flash memory cell of prior art.

DESCRIPTION OF THE PREFERRED EMBODIMENTS

Figure 2A:
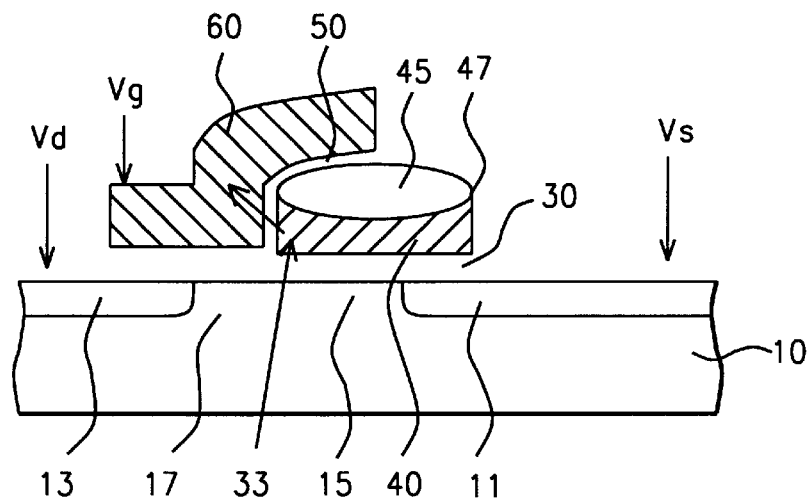
FIG. 2a is cross-sectional view of a portion of a semiconductor substrate showing the patterning of a first photoresist layer formed over a layer of nitride overlying first polysilicon layer which in turn is formed over the gate oxide layer, according to this invention.

Referring now to the drawings, in particular to FIGS. 2a–2j there is shown steps of forming nitride spacers underlying an interpoly-oxide layer in a split-gate flash memory cell of this invention. FIGS. 2a–2f show a method of forming memory cells currently employed in the present manufacturing line. FIGS. 2g–2j show a preferred method of forming cells with a more uniformly thick inter-poly oxide layer, thereby improving the erase speed of the preferred cells. This is accomplished by reversing the order of currently practiced process steps such that nitride spacers are formed prior to forming the inter-poly oxide, thereby reducing the variations in the thickness of the inter-poly oxide within a wafer as well as between wafers on the same production line.

In FIG. 2a, gate oxide layer (120) is formed over substrate (100), preferably silicon. Gate oxide (120) can be formed by thermal oxidation process at a temperature between about 850 to 1000° C. Alternatively, the gate oxide can be formed by an atmospheric or low pressure chemical vapor deposition (LPCVD) process as is well known. Gate oxide layer (120) has a thickness between about 90 to 110 angstroms (Å).

Figure 2B:
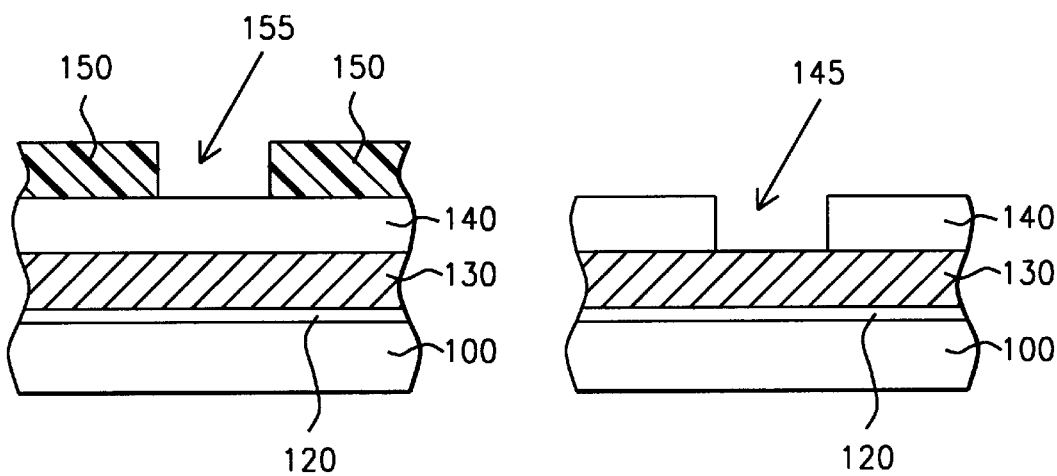
FIG. 2b is a cross-sectional view of a portion of a semiconductor substrate showing the forming of an opening in the nitride layer of FIG. 2a and exposing portion of the first polysilicon layer, according to this invention.

Next, first polysilicon layer (130) is formed over the gate oxide layer through reduction of $SiH_4$ using LPCVD at a temperature between about 500 to 800° C. The preferred thickness of the first layer of polysilicon is between about 1400 to 1600 Å. This is followed by forming a first nitride layer (140) shown in FIG. 2a by reacting dichlorosilane ($SiCl_2H_2$) with ammonia ($NH_3$) in an LPCVD at a temperature between about 700 to 900° C. The preferred thickness of the nitride layer is between about 1400 to 1600 Å. A photoresist mask (150) having patterns (155) is next formed over the nitride layer to a thickness between about 8000 to 12000 Å corresponding to areas where floating gates are to be defined also as shown in FIG. 2a. The patterns are then etched into nitride layer (140) forming openings (145) where portion of the underlying first polysilicon layer (130) is exposed as shown in FIG. 2b. It is preferred that the etching of nitride layer (140) is accomplished with a recipe comprising gases $CF_4$ and $CHF_3$. Afterwards, the photoresist layer is removed by oxygen plasma ashing.

Figures 2C, 2D:
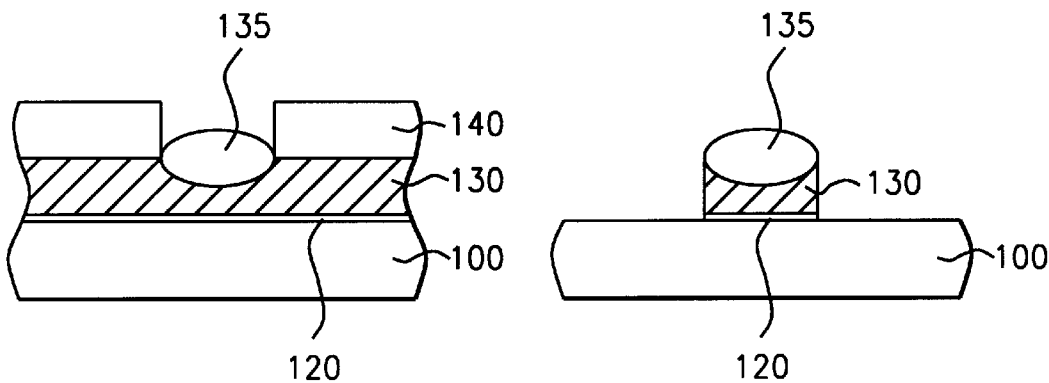
FIG. 2c is a cross-sectional view of a portion of a semiconductor substrate showing the forming of polyoxide over the exposed portion of the first polysilicon layer of FIG. 2b, according to this invention.
FIG. 2d is a cross-sectional view of a portion of a semiconductor substrate showing the forming of the floating gate of this invention.

Next, first polysilicon layer (130) that is exposed in the pattern openings (145) in the nitride layer is oxidized to form polyoxide (135) as shown in FIG. 2c. Subsequently, the nitride layer is removed where now polyoxide (135) serves as a hard mask to remove all the first polysilicon portions except those that are covered by the overlying polyoxide layer as shown in FIG. 2d. The etching of the polysilicon is accomplished with a recipe comprising $Cl_2$ and HBr. The gate oxide layer (120) is also removed.

Figures 2E, 2F:
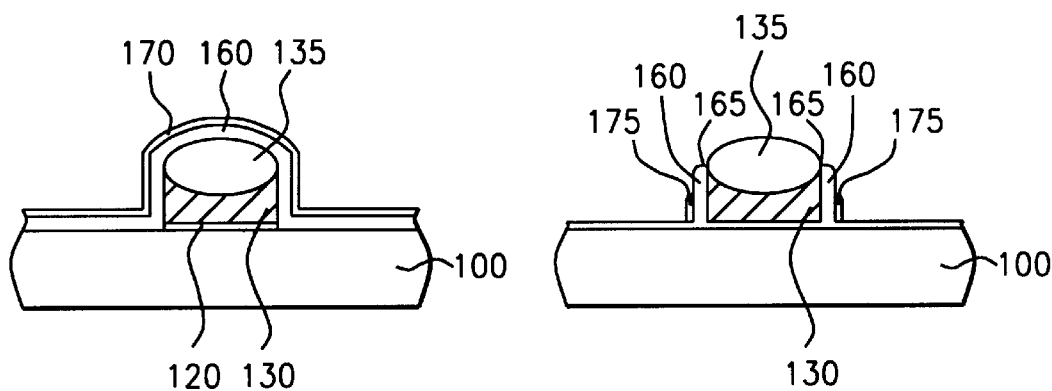
FIG. 2e is cross-sectional view of a portion of a semiconductor substrate showing the growing of an inter-poly oxide layer and a nitride layer as currently practiced in the manufacturing line.
FIG. 2f is a cross-sectional view of a portion of a semiconductor substrate showing the forming of the nitride spacers as currently practiced in the manufacturing line.

Then, following the present practice of forming split-gate flash memory cells, an inter-poly oxide layer (160) is formed as shown in FIG. 2e, which is followed by the forming of a thin nitride layer (170) as shown in the same Figure. At the next step, nitride layer (170) is anisotropically etched to form spacers (175) as shown in FIG. 2f. However, it is the experience of the present practice that inter-poly oxide layer gets damaged substantially in regions (165) shown in FIG. 2f, during the etching of the nitride layer. It will be appreciated by those skilled in the art that such random damage in general, and the resulting variations in the thickness of the inter-poly oxide between the floating gate and the control gate to be formed will cause variations in the erase speed of the memory cell, which is undesirable. It is also evident that these variations will occur not only between the memory devices that are fabricated in the same wafer, but also between wafers. It is disclosed in the preferred embodiments shown in FIGS. 2g–2j a method to avoid damage to the inter-poly oxide in general, and variations in its thickness in particular, by forming the inter-poly oxide after the forming of the nitride spacers.

Figure 2G:
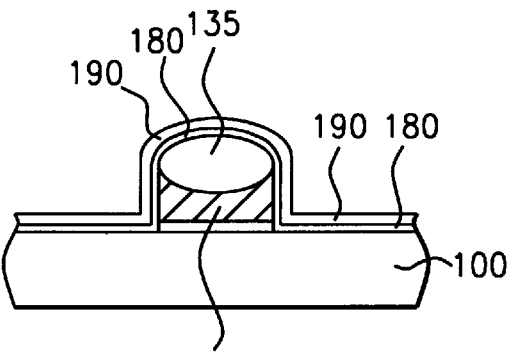
FIG. 2g is a cross-sectional view of a portion of a semiconductor substrate showing the preferred embodiment of the forming of, first, a pad oxide layer and then a thin nitride layer, according to the present invention.

Thus, as a key aspect of the present invention, a pad-oxide layer (180) is first formed over the substrate as shown in FIG. 2g. This is accomplished by thermally growing the pad oxide layer at a temperature between about 850 to 950° C., and to a thickness between about 100 to 200 Å. Next, a second nitride layer (190) is formed over the padoxide layer in an LPCVD at a temperature between about 700 to 900° C. It is important that the thickness of the nitride layer is between about 200 to 400 Å.

Figure 2H:
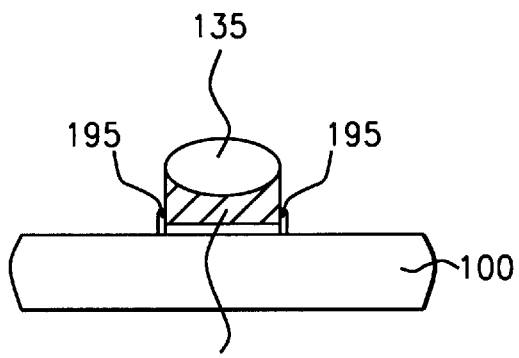
FIG. 2h is a cross-sectional view of a portion of a semiconductor substrate showing the preferred embodiment of the forming of the nitride spacers of the present invention.
Figure 2I:
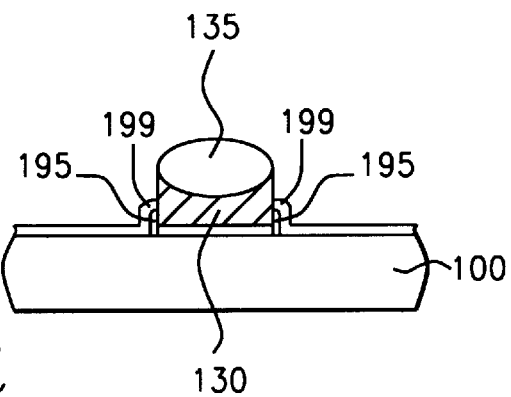
FIG. 2i is a cross-sectional view of a portion of a semiconductor substrate showing the preferred embodiment of the forming of an inter-poly oxide layer over the nitride spacers of FIG. 2h, according to this invention.

Then, the second nitride layer is etched to form nitride spacers (195) having a width and height between about 200 to 400 Å and 100 to 500 Å, respectively, as shown in FIG. 2h. The etching is performed with a recipe comprising gases $SF_6$, $CF_4$, $CHF_3$ and $O_2$. Nitride spacers are important for they provide the means for preventing reverse tunneling, or "disturb" phenomenon known in the art. Basically, in the absence of barriers, such as spacers, or with poorly defined small or damaged spacers, the performance of the memory cell is degraded. The performance is further degraded if the inter-poly oxide between the floating gate and the control gate is additionally uneven due to the damage imparted to the conventionally underlying nitride spacers.

It is also to be noted that along with the etching away of nitride layer (190) during the forming of spacers (195), the underlying layer of pad oxide (180) that is exposed above the spacers must also be removed so that the inter-poly oxide that is to be formed subsequently does not suffer thickness variations especially in the tip area of polyoxide (135). A 1% HF hydrofluoric solution is preferred for removing the pad oxide layer.

Thus, as a main feature and another key aspect of the present invention, an inter-poly oxide layer is formed over the nitride spacers, rather than in the traditional reverse order. Thus, in FIG. 2i, inter-poly oxide layer (199) is thermally grown over nitride spacers (195), preferably at a temperature between about 800 to 1000° C. It is also preferred that the thickness of the inter-poly oxide is between about 140 to 250 Å.

Figure 2J:
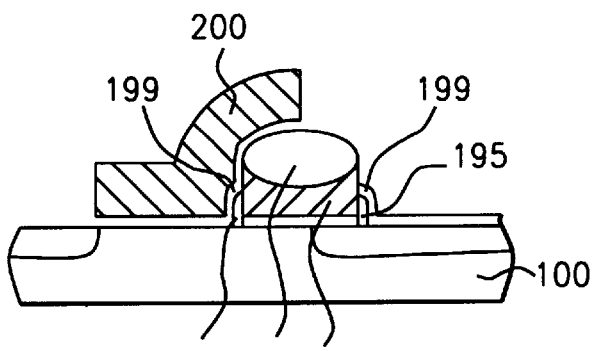
FIG. 2j is a cross-sectional view of a portion of a semiconductor substrate showing the split-gate flash memory cell of this invention.

After having formed the inter-poly oxide layer, (199), of this invention, the completion of the split-gate is accomplished by first blanket depositing (not shown) over the substrate a second polysilicon layer and patterning it to form control gate (200) as shown in FIG. 2j. It is preferred that the second layer of polysilicon is formed using silicon source $SiH_4$ in an LPCVD chamber at a temperature between about 530 to 630° C., and that it has a thickness between about 1000 to 3000 Å.

While the invention has been particularly shown and described with reference to the preferred embodiments thereof, it will be understood by those skilled in the art that various changes in form and details may be made without departing from the spirit and scope of the invention.

What is claimed is:

1. A method of forming a nitride spacer underlying inter-poly oxide layer in a split-gate flash memory cell comprising the steps of:

providing a substrate having a plurality of active and field regions defined;

forming a gate oxide layer over said substrate;

forming a first polysilicon layer over said gate oxide layer;

forming a first nitride layer over said first polysilicon layer;

patterning said first nitride layer to define a floating gate region over said first polysilicon layer;

forming a poly-oxide layer over said first polysilicon layer;

etching said first polysilicon layer to form a floating gate structure;

forming a pad oxide layer over said first polysilicon layer and said substrate;

forming a second nitride layer over said pad oxide layer;

etching said second nitride layer to form nitride spacers;

removing said pad oxide layer;

forming an inter-poly oxide layer over said substrate;

forming a second polysilicon layer over said inter-poly oxide layer; and patterning said second polysilicon layer to form a control gate structure of said split-gate flash memory cell.

2. The method of claim 1, wherein said forming said gate oxide layer is accomplished by thermal growth at a temperature between about 850 to 1000° C.

3. The method of claim 1, wherein said gate oxide layer has a thickness between about 70 to 110 Å.

4. The method of claim 1, wherein said forming said first polysilicon layer is accomplished with silicon source $SiH_4$ using LPCVD at a temperature between about 500 to 650° C.

5. The method of claim 1, wherein said first polysilicon layer has a thickness between about 800 to 1600 Å.

6. The method of claim 1, wherein said forming said first nitride layer is formed by reacting dichlorosilane ($SiCl_2H_2$) with ammonia ($NH_3$) in an LPCVD at temperature range between about 650 to 850° C.

7. The method of claim 1, wherein the thickness of said first nitride layer is between about 500 to 1500 Å.

8. The method of claim 1, wherein the thickness of said poly-oxide layer is between about 1000 to 1800 Å.

9. The method of claim 1, wherein said etching said first polysilicon layer to define floating gate is accomplished with a recipe comprising $Cl_2$ and HBr.

10. The method of claim 1, wherein said pad oxide layer has a thickness between about 100 to 200 Å.

11. The method of claim 1, wherein said second nitride layer has a thickness between about 200 to 400 Å.

12. The method of claim 1, wherein said etching said second nitride layer to form nitride spacers is accomplished with a recipe comprising $SF_6$, $CF_4$, $CHF_3$ and $O_2$.

13. The method of claim 1, wherein said removing said pad oxide layer is accomplished with a recipe comprising 1% HF solution.

14. The method of claim 1, wherein said inter-poly oxide layer has a thickness between about 140 to 250 Å.

15. The method of claim 1, wherein said forming said second polysilicon layer over said inter-poly oxide layer is accomplished with silicon source $SiH_4$ using LPCVD at a temperature between about 530 to 630° C.

16. The method of claim 1, wherein said second polysilicon layer has a thickness between about 1000 to 3000 Å.

17. A method of forming a nitride spacer underlying inter-poly oxide layer in a split-gate flash memory cell comprising the steps of:

providing a substrate having a plurality of active and field regions defined;

forming a floating gate having sidewalls in said substrate;

forming a pad oxide layer over said substrate including said floating gate having sidewalls;

forming nitride spacers adjacent said sidewalls of said floating gate;

forming an inter-poly dielectric layer over said substrate including said floating gate; and forming a control gate over said floating gate to complete the forming of said split-gate flash memory cell.

18. The method of claim 17, wherein said pad oxide layer has a thickness between about 100 to 200 Å.

19. The method of claim 17, wherein said nitride spacer has a thickness between about 200 to 400 Å.

20. The method of claim 17, wherein said nitride spacers have a width between about 200 to 400 Å.

21. The method of claim 17, wherein said inter-poly dielectric layer has a thickness between about 140 to 250Å.

* * * * *